United States Patent
Kim et al.

(10) Patent No.: US 11,097,947 B2
(45) Date of Patent: Aug. 24, 2021

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Min Kyoung Kim, Daejeon (KR); Yu Ho Min, Daejeon (KR); Cheol Hee Park, Daejeon (KR); Kyung Moon Ko, Daejeon (KR); Chee Sung Park, Daejeon (KR); Myung Jin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/484,945

(22) PCT Filed: Sep. 28, 2018

(86) PCT No.: PCT/KR2018/011567
§ 371 (c)(1),
(2) Date: Aug. 9, 2019

(87) PCT Pub. No.: WO2019/066580
PCT Pub. Date: Apr. 4, 2019

(65) Prior Publication Data
US 2020/0002168 A1 Jan. 2, 2020

(30) Foreign Application Priority Data

Sep. 29, 2017 (KR) .................. 10-2017-0128180
Sep. 27, 2018 (KR) .................. 10-2018-0115325

(51) Int. Cl.
*C01B 19/00* (2006.01)
*C30B 29/46* (2006.01)
(Continued)

(52) U.S. Cl.
CPC ............ *C01B 19/002* (2013.01); *C30B 29/46* (2013.01); *C30B 33/02* (2013.01); *H01L 35/16* (2013.01); *H01L 35/28* (2013.01); *C01P 2002/30* (2013.01)

(58) Field of Classification Search
None
See application file for complete search history.

(56) References Cited

U.S. PATENT DOCUMENTS 6,312,617 B1 * 11/2001 Kanatzidis ............ H01L 31/032
252/62.3 T
9,653,672 B2 5/2017 Rhyee et al.
(Continued)

FOREIGN PATENT DOCUMENTS

| CN | 102007574 A | 4/2011 |
|---|---|---|
| JP | 2015-103695 A | 6/2015 |

(Continued)

OTHER PUBLICATIONS

European Search Report for Application No. 18861790.6 dated Mar. 3, 2020.
(Continued)

*Primary Examiner* — Daniel S Gatewood
(74) *Attorney, Agent, or Firm* — Birch, Stewart, Kolasch & Birch, LLP (57) ABSTRACT

A chalcogen-containing compound of the following chemical formula which exhibits an excellent thermoelectric performance index (ZT) through an increase in power factor and a decrease in thermal conductivity, a method for preparing the same, and a thermoelectric element including the same: $M_yV_{1-y}Sn_xSb_2Te_{x+3}$, wherein V is vacancy, M is at least one alkali metal, $x \geq 6$, and $0 < y \leq 0.4$.

13 Claims, 9 Drawing Sheets

(51) Int. Cl.
*C30B 33/02* (2006.01)
*H01L 35/16* (2006.01)
*H01L 35/28* (2006.01)

(56) References Cited

U.S. PATENT DOCUMENTS

| | | |
|---|---|---|
| 2010/0139730 A1 | 6/2010 | Bentien et al. |
| 2011/0027976 A1 | 2/2011 | Lee et al. |
| 2015/0144865 A1 | 5/2015 | Soeya et al. |
| 2016/0099396 A1 | 4/2016 | Lee et al. |
| 2016/0122548 A1 | 5/2016 | Yuhasz |
| 2019/0055136 A1 | 2/2019 | Kanatzidis et al. |

FOREIGN PATENT DOCUMENTS

| | | | |
|---|---|---|---|
| JP | 6053186 B2 | | 12/2016 |
| KR | 10-2014-0116668 A | | 10/2014 |
| KR | 10-2017-0041540 A | | 4/2017 |
| KR | 20170041540 A | * | 4/2017 |
| KR | 10-2017-0080673 A | | 7/2017 |
| WO | WO 2017/079129 A1 | | 5/2017 |

OTHER PUBLICATIONS

Gueguen, A., et al., "Thermoelectric Properties of the Nanostructured NaPb18-xSnxMTe20 (M=Sb, Bi) Materials," Jan. 1, 2008, Mater. Res. Soc. Symp. Proc., vol. 1044, pp. 349-354.

Welzmiller, S. et al., "Increasing Seebeck Coefficients and Thermoelectric Performance of Sn/Sb/Te and Ge/Sb/Te Materials by Cd Doping," Advanced Electronic Materials, Dec. 1, 2015, vol. 1, No. 12, pp. 1500266 (1-12).

Banik et al., "Lead-free thermoelectrics: promising thermoelectric performance in p-type SnTe1-xSex system," J. Mater. Chem. A, vol. 2, 2014, pp. 9620-9625.

Banik et al., "The origin of low thermal conductivity in Sn1-xSbxTe: phonon scattering via layered intergrowth nanostructures," Energy Environ. Sci., 2016, pp. 1-25.

Cheary et al., "A Fundamental Parameters Approach to X-ray Line-Profile Fitting," J. Appl. Cryst., vol. 25, 1992, pp. 109-121.

International Search Report (PCT/ISA/210) issued in PCT/KR2018/011567, dated Apr. 18, 2019.

Orabi et al., "Ultralow Lattice Thermal Conductivity and Enhanced Thermoelectric Performance in SnTe:Ga Materials," Chem. Mater., vol. 29, Dec. 12, 2016, 9 pages.

Rosenthal et al., "Nanostructured rocksalt-type solid solution series (Ge1-xSnxTe)nSb2Te3 (n=4, 7, 12; 0 ≤ x ≤ 1): Thermal behavior and thermoelectric properties," Journal of Solid State Chemistry, vol. 215, 2014, pp. 231-240.

Roychowdhury et al., "An enhanced Seebeck coefficient and high thermoelectric performance in p-type In and Mg co-doped Sn1-xPbx Te via the co-adjuvant effect of the resonance level and heavy hole valence band," J. Mater. Chem. C, vol. 5, 2017, pp. 5737-5748.

Tan et al., "Extraordinary role of Hg in enhancing the thermoelectric performance of p-type SnTe," Energy Environ. Sci., 2014, 11 pages.

Zhang et al., "High thermoelectric performance by resonant dopant indium in nanostructured SnTe," Proc. Natl. Acad. Sci., vol. 110, No. 33, Aug. 13, 2013, pp. 13261-13266.

Gueguen et al., "Thermoelectric Properties and Nanostructuring in the p-Type Materials NaPb$_{18-x}$Sn$_x$MTe$_{20}$ (M=Sb, Bi)," Chemistry of Materials, 2009, vol. 21, No. 8, pp. 1683-1694.

* cited by examiner

CHALCOGEN-CONTAINING COMPOUND, ITS PREPARATION METHOD AND THERMOELECTRIC ELEMENT COMPRISING THE SAME

CROSS-REFERENCE TO RELATED APPLICATION(S)

This application claims the benefits of the filing dates of Korean Patent Application No. 10-2017-0128180 filed with the Korean Intellectual Property Office on Sep. 29, 2017 and Korean Patent Application No. 10-2018-0115325 filed with Korean Intellectual Property Office on Sep. 27, 2018, the entire contents of which are incorporated herein by reference.

TECHNICAL FIELD

The present invention relates to a novel chalcogen-containing compound which exhibits an excellent thermoelectric performance index (ZT) through an increase in power factor and a decrease in thermal conductivity, a method for preparing the same, and a thermoelectric element including the same.

BACKGROUND ART

Recently, due to resource depletion and environmental problems caused by combustion, research on thermoelectric conversion materials using waste heat as one of alternative energies has accelerated.

The energy conversion efficiency of thermoelectric conversion materials depends on ZT, which is the thermoelectric performance index value of the thermoelectric conversion material. ZT is determined according to the Seebeck coefficient, electrical conductivity, thermal conductivity, and the like as shown in the following Equation 1, and more specifically, it is proportional to the square of the Seebeck coefficient and the electrical conductivity, and is inversely proportional to thermal conductivity.

$$ZT = S^2 \sigma T/k, \qquad \text{[Equation 1]}$$

(In Equation 1, $\sigma$ is the electrical conductivity, S is the Seebeck coefficient, and T is the absolute temperature, and k is the thermal conductivity).

Therefore, in order to increase the energy conversion efficiency of the thermoelectric conversion element, it is necessary to develop a thermoelectric conversion material having a high Seebeck coefficient (S) or electrical conductivity ($\sigma$) and thus exhibiting a high power factor (PF=$\sigma S^2$) or having low thermal conductivity (k).

Among various thermoelectric conversion materials which have been known for a long time, for example, a thermoelectric conversion material having a crystal lattice structure related to or similar to sodium chloride (NaCl), such as PbTe, $Bi_2Te_3$, SnSe, or the like, in which some of lattice sites are vacant, is known to exhibit excellent thermoelectric conversion characteristics. Materials having such a crystal lattice structure exhibit excellent electrical conductivity, and also exhibit low thermal conductivity as some of the lattice sites are vacant. Thus, excellent thermoelectric conversion characteristics can be exhibited.

Figure 1:
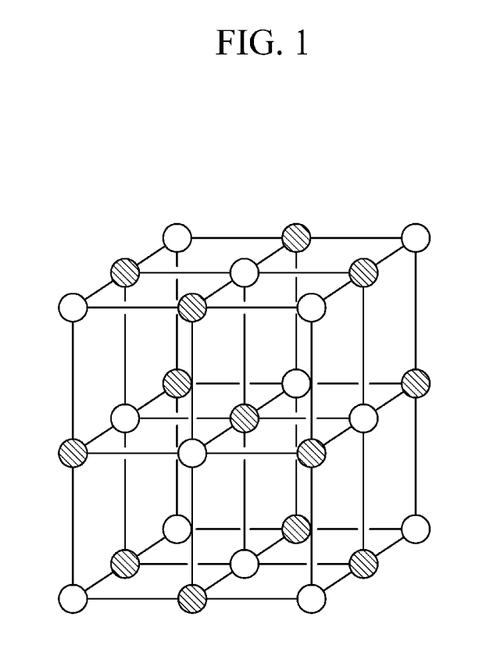
FIG. 1 is a schematic view showing a face-centered cubic lattice structure.

However, a thermoelectric conversion material having vacancies in which some of the lattice sites are vacant while having the same face-centered cubic lattice structure as that of sodium chloride, as shown in FIG. 1, is almost unknown.

Generally, as a complex symmetrical structure is higher and constituent atoms are is heavier, it is possible to prevent movement of phonons and reduce thermal conductivity. If there are vacancies in the lattice, the thermal conductivity can be further lowered.

In the case of $Sn_4Bi_2Se_7$ of a conventionally-developed face-centered cubic lattice or rock-salt structure, vacancies are partially included in the latter and thus the thermal conductivity is low but the output factor is also low.

Therefore, there is a need to develop a thermoelectric material capable of simultaneously realizing a high output factor due to the face-centered cubic lattice structure and low thermal conductivity due to the introduction of vacancies.

DETAILED DESCRIPTION OF THE INVENTION

Technical Problem

An object of the present invention is intended to provide a novel chalcogen-containing compound which exhibits an excellent thermoelectric performance index (ZT) through an increase in power factor and a decrease in thermal conductivity, and a method for preparing the same.

Another object of the present invention is intended to provide a thermoelectric element which includes the above-mentioned chalcogen-containing compound and thus exhibits its excellent thermoelectric properties.

Technical Solution

The present invention provides a chalcogen-containing compound represented by the following Chemical Formula 1:

$$M_y V_{1-y} Sn_x Sb_2 Te_{x+3} \qquad \text{[Chemical Formula 1]}$$

wherein, in the above Formula 1, V is vacancy, M is an alkali metal, x≥6, and 0<y≤0.4.

The present invention also provides a method for preparing the above-mentioned chalcogen-containing compound including: mixing raw materials of Sn, Sb, Te, and M (alkali metal) so that the molar ratio of Sn:Sb:Te:M is x:2:(x+3):y and then subjecting the mixture to a melting reaction (wherein x≥6 and 0<y≤0.4); heat-treating the resultant product obtained through the melting reaction; pulverizing the resultant product obtained through the heat treatment; and sintering the pulverized product.

In addition, the present invention provides a thermoelectric element including the chalcogen-containing compound as a thermoelectric conversion material.

Hereinafter, the chalcogen-containing compound according to specific embodiments of the present invention, the method for preparing the same, and the thermoelectric element including the same will be described in more detail.

The chalcogen-containing compound according to one embodiment of the present invention is a compound represented by the following Chemical Formula 1:

$$M_y V_{1-y} Sn_x Sb_2 Te_{x+3} \qquad \text{[Chemical Formula 1]}$$

wherein, in the above Formula 1, V is vacancy, M is at least one alkali metal, x≥6, and 0<y≤0.4.

The chalcogen-containing compound of the one embodiment has a face-centered cubic lattice composed of Sn, Sb, Te, and an alkali metal (M), wherein a part of the lattice site includes a vacancy (V), which is a vacant site, and a part of the vacancy (V) has a structure filled with an alkali metal (M), thereby simultaneously realizing a high power factor due to the atomic connectivity of the face-centered cubic lattice structure, and a low thermal conductivity due to the introduction of the vacancies. In addition, it is possible to exhibit an improved thermoelectric performance index (ZT) due to reduction of thermal conductivity while maintaining excellent power factors by the alkali metal (M) in which a part of vacancies is filled.

Specifically, the chalcogen-containing compound of the one embodiment has a vacancy (V) which is a vacant site excluding the sites filled with Sn, Sb, and Te in the face-centered cubic lattice structure, and the alkali metal (M) is filled in a part of the vacancy (V). Filling of the alkali metal (M) in the vacancy (V) can be confirmed from the increase of the lattice volume due to the increase of the lattice parameter, as compared with the chalcogen-containing compound having the same Sn content.

More specifically, in the face-centered cubic lattice structure of the chalcogen-containing compound of this embodiment, the Te is filled in an anion site of the face-centered cubic lattice, the Sn and Sb are filled in a cationic site of the face-centered cubic lattice, the face-centered cubic lattice structure includes a vacancy in a site of the remaining cationic sites excluding the sites filled with the Sn and Sb, and the alkali metal (M) is filled in at least a part of the vacancy (V).

Figure 2:
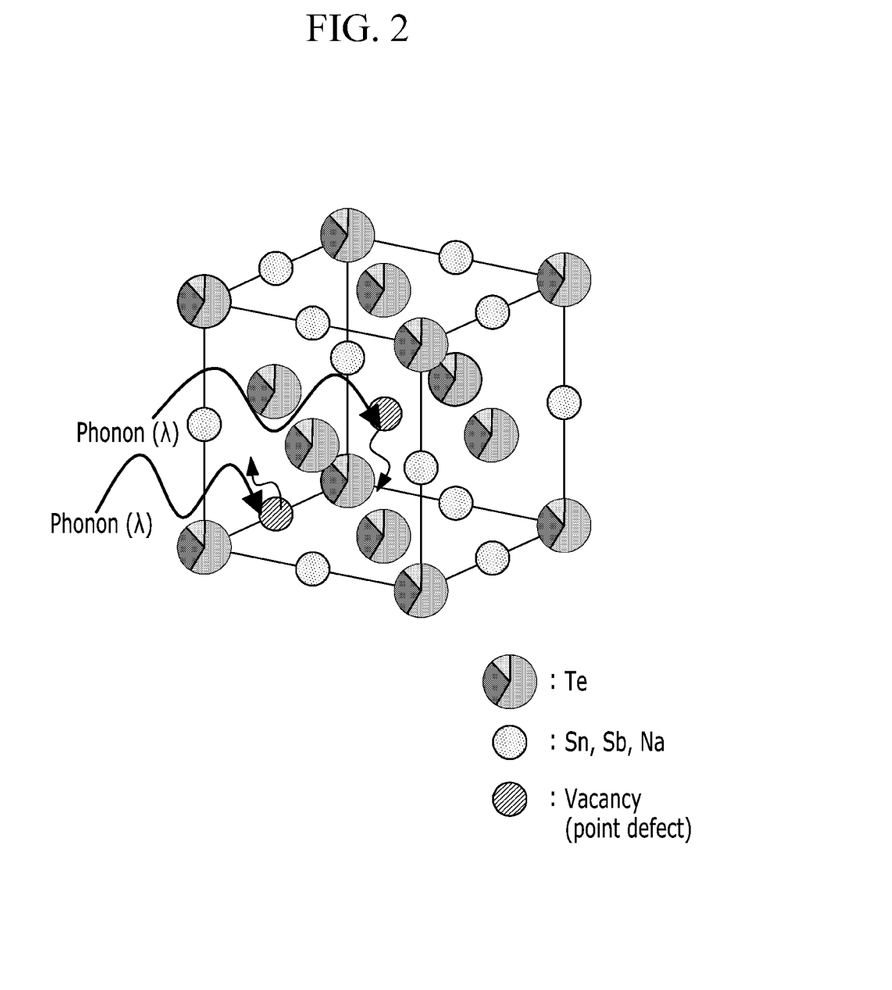
FIG. 2 is a schematic diagram showing the crystal structure of the chalcogen-containing compound according to an embodiment of the present invention.

FIG. 2 is a schematic diagram showing the crystal structure of the chalcogen-containing compound according to one embodiment of the present invention. FIG. 2 is presented for illustrative purpose only, and is not intended to limit the scope of the present invention thereto.

Referring to FIG. 2, the chalcogen-containing compound of the one embodiment basically has the same face centered cubic structure as SnTe, wherein a vacancy (V) is introduced into the cationic site. Specifically, the vacancy (V), Sn, Sb, and alkali metals (M) represented by Na are randomly distributed at the site of (x, y, z)=(0, 0, 0), and Te is distributed at the site of (0.5, 0.5, 0.5). As described in experimental examples provided later, this can be confirmed from the result of Rietveld refinement of the chalcogen-containing compound powder calculated via the TOPAS program.

In the chalcogen-containing compound of Chemical Formula 1, the large radius of $Sn^{2+}$ (118 pm) is larger than that of $Sb^{3+}$ (76 pm). Therefore, as the Sn content increases (as the [Sn]/[Sb] ratio increases) and as the substitution amount of the alkali metal (M) in the vacancy (V) increases, the lattice parameter increases. Specifically, the chalcogen-containing compound powder calculated by the TOPAS program has a lattice parameter of 6.2600 to 6.2900 Å and Rwp (weighted pattern R) of 4.50 to 6.90.

In the chalcogen-containing compound of the one embodiment, the addition of the alkali metal (M) leads to a decrease in the hole charge concentration as a charge carrier, and as a result, the thermal conductivity contributed by the charge carrier can be reduced, as demonstrated even in examples described later. At the same time, the alkali metal does not fill all of the vacant lattice sites and some of the vacancies remain, and thus, the thermal conductivity can be further reduced. In addition, the alkali metal (M) additionally supplies electrons together with Sn and Sb filling the respective cation sites, and thus the electrical conductivity is lowered and the Seebeck coefficient is increased. As a result, the power factor can be compensated.

In detail, in the chalcogen-containing compound, the alkali metal (M) supplies additional electrons by filling part of the holes. Thus, electrons are additionally supplied to a p-type material to lower the hole charge concentration which is a p-type main charge carrier, and consequently, the electrical conductivity is reduced, but at the same time the power factor (PF) can be compensated due to the increase of the Seebeck coefficient. In addition, of the thermal conductivity, the thermal conductivity contributed by the charge carrier can be reduced. Accordingly, the thermoelectric performance index (ZT) can be increased by reducing the thermal conductivity only while maintaining the powder factor. In the chalcogen-containing compound of the one embodiment, as the alkali metal (M), at least one selected from the group consisting of Na and K may be used. However, Na can be used in consideration of the maintenance of the power factor due to the introduction of the alkali metal and the effect of improving the thermoelectric performance index due to the decrease of the thermal conductivity.

On the other hand, the vacancies (V) are in a state in which atoms of lattice points are deficient in a specific crystal lattice structure. In the chalcogen-containing compound of the one embodiment, the vacancies (V) play a very important role in forming the same face-centered cubic lattice structure as that of sodium chloride. If the vacancies are completely filled with the alkali metal (M), Sn, Sb, and Te, secondary phases having different crystal structures other than the face-centered cubic lattice structure may be formed together, and as a result, the physical properties such as electrical conductivity are lowered, and there is a problem that it is difficult to apply to a thermoelectric conversion material. In addition, since the vacancy (V) facilitates diffusion of atoms, heat treatment, deformation, precipitation, or phase transformation may be varied depending on the presence or absence of the vacancies. In the case of the chalcogen-containing compound of the one embodiment, low lattice thermal conductivity can be exhibited by the phonon scattering by vacancies, and due to this, excellent thermoelectric conversion characteristics can be exhibited.

Further, in the chalcogen-containing compound of the one embodiment, the alkali metal (M), the vacancy (V), Sn, Sb, and Te are contained in a molar ratio of $y:(1-y):x:2:(x+3)$. In this case, x representing the content of Sn is 6 or more, and y representing the content of the alkali metal (M) is more than 0 and 0.4 or less.

When the content of Sn, that is, x is 6 or more ($x \geq 6$), a compound having a single phase, face-centered cubic lattice structure is formed, and excellent thermoelectric properties can be exhibited. However, if x is less than 6 (x<6), a secondary phase having a structure other than the face-centered cubic lattice structure is formed as in a rhombohedral structure.

Further, when y, which is the alkali metal content, is 0, an alkali metal does not exist in the chalcogen-containing compound, and thus it is not possible to obtain an improvement effect due to the filling of the alkali metal. Further, when y is more than 0.4, a secondary phase may be formed, which leads to deterioration of thermoelectric properties.

Considering the remarkable effects of improving the thermoelectric properties by controlling the mole ratio of each element including the vacancy, more specifically, $6 \leq x \leq 12$ and $0.01 \leq y \leq 0.4$. Still more specifically, x may be an integer of 6 or more, 8 or more, 12 or less, or 10 or less, and y may be a rational number of 0.1 or more, 0.2 or more, and 0.4 or less.

Further, in the chalcogen-containing compound according to the one embodiment, Sn:Sb:Te is included so as to satisfy the molar ratio condition of $x:2:(x+3)$. Sn is bonded in the state of $Sn^{2+}$, Sb is bonded in the state of $Sb^{3+}$, and Te is bonded in the state of $Te^{2-}$. Therefore, when included in the above molar ratio relationship, the charge neutrality can be matched as $2x+(3\times2)-2(x+3)=0$.

Considering the remarkable improvement effect due to the optimization of constituent elements and content, the chalcogen-containing compound according to this embodiment may have a face-centered cubic lattice structure in which M is Na, x is 6 or more, 8 or more, 12 or less, or 10 or less, y is 0.1 or more, 0.2 or more, and 0.4 or less, and M is filled in a part of the vacancy (V).

Specifically, the chalcogen-containing compound according to one embodiment of the present invention may be $Na_{0.2}V_{0.8}Sn_6Sb_2Te_9$, $Na_{0.2}V_{0.8}Sn_8Sb_2Te_{11}$, $Na_{0.2}V_{0.8}Sn_{10}Sb_2Te_{13}$, $Na_{0.2}V_{0.8}Sn_{12}Sb_2Te_{15}$, $Na_{0.1}V_{0.9}Sn_8Sb_2Te_{11}$, $Na_{0.4}V_{0.6}Sn_8Sb_2Te_{11}$, or the like.

The chalcogen-containing compound of one embodiment of the present invention as described above can solve the problem of a low power factor of conventional thermoelectric materials such as $Sn_4Bi_2Se_7$, by filling a part of the vacancy with an alkali metal. Thus, the thermoelectric performance index can be greatly improved through introduction of vacancies and reduction of thermal conductivity due to alkali metals while maintaining excellent power factor characteristics resulting from the face-centered cubic structure. As a result, the chalcogen-containing compound of the one embodiment can be very suitably used as a thermoelectric conversion material in various fields and applications including various thermoelectric cooling systems, thermoelectric power generation systems, and the like.

On the other hand, according to another embodiment of the present invention, a method for preparing the above-mentioned chalcogen-containing compound is provided.

Specifically, the preparation method may include the steps of: mixing raw materials of Sn, Sb, Te, and M (alkali metal) so that the molar ratio of Sn:Sb:Te:M is x: 2:(x+3):y and then subjecting the mixture to a melting reaction (wherein x is 6 or more, and y is more than 0 and 0.4 or less); heat-treating the resultant product obtained through the melting reaction; pulverizing the resultant product obtained through the heat treatment; and sintering the pulverized product.

In the above preparation method, as the raw materials containing Sn, Sb, Te, and alkali metals (M), for example, a shot (particle without edges) and/or a powder of Sn, Sb, Te and alkali metal (M) may be used. Further, a powder of $M_2Se$ (M is an alkali metal) such as $Na_2Se$ may be used. If necessary, the pulverization step through grinding or milling may optionally be further carried out before mixing the above-mentioned raw materials.

Further, the mixing of these respective raw materials can be carried out by mixing the raw materials such that the molar ratio of the respective elements in Chemical Formula 1, specifically, the molar ratio of Sn, Sb, Te, and the alkali metal (M) is a ratio corresponding to x:2:(x+3):y, and then grinding or milling the mixture and optionally pelletizing it. At this time, x and y are the same as described above. The mixture thus formed may be in a powder state, a pellet state, or an ingot state depending on its formation step.

Then, a step of melting the mixture prepared above is carried out.

During the melting step, the reaction between the metal raw materials of the aforementioned metals is performed, and the result of the reaction is obtained in the form of a melt.

Specifically, the melting step can be carried out by charging the mixture into a quartz tube and then heating it at a temperature of 700° C. to 900° C., more specifically a temperature of 750° C. to 800° C., under vacuum and in a sealed state. At this time, in order to prevent the reaction between the raw material and the quartz tube, the mixture may be first placed in a carbon crucible and then charged into the quartz tube.

After completion of the melting step, a step of cooling the produced melt may optionally be further performed in order to shorten the subsequent heat treatment process time.

The cooling step includes cooling using a medium, and any cooling method used in the field of thermoelectric materials can be applied without limitation. For example, the cooling step may be carried out by natural cooling or cold air cooling, and it can be carried out until the temperature of the melt reaches the level of room temperature (23±5° C.).

Next, a step of heat-treating the melt obtained through the melting step is carried out.

The heat treatment is a step for forming a single phase, face-centered cubic lattice structure. Specifically, it can be carried out at a temperature of 550 to 640° C., more specifically, 600 to 640° C. for 24 to 72 hours. Further, the heat treatment may be carried out in a furnace such as an electric furnace, and it can be carried out under vacuum or in an inert gas atmosphere.

In addition, the heat treatment step may be carried out in a single step or may be performed in two or more steps.

Next, after the heat treatment step, a step of pulverizing the heat-treated product is carried out.

The pulverizing step may be carried out using previously known methods and devices for producing thermoelectric conversion materials. Through this pulverizing step, a resultant product in a powder state can be obtained.

On the other hand, between the heat treatment step and the pulverization step, a step of cooling the resultant of the heat treatment step to form an ingot may be further carried out as needed.

At this time, the cooling step may be carried out using various cooling media, and all of cooling devices/cooling methods previously applied in the manufacturing process of thermoelectric conversion materials can be applied without particular limitation. In the case of forming ingots through this cooling step, a step of pulverizing the ingots may be carried out.

After the pulverizing step described above, a step of sintering the pulverized product is carried out. By progression of this sintering step, the chalcogen-containing compound of the one embodiment already described above can be produced in the sintered state. Such a sintering step can be carried out by a spark plasma sintering method or the like that are well-known to those skilled in the art.

The sintering step may be carried out, specifically, at a temperature of 550 to 640° C. under a pressure of 10 to 100 MPa. More specifically, it may be carried out at a temperature of 600 to 640° C. under a pressure of 30 to 100 MPa for 5 to 10 minutes.

After the sintering step, a cooling step may be further carried out as needed. The cooling step can be carried out according to a conventional method as previously described.

However, each of the above-described steps may be carried out by applying conventional manufacturing conditions, methods, and devices for forming a metal compound such as a thermoelectric conversion material or a chalcogen-containing compound. Specific reaction conditions and methods are described in examples provided later, so an additional description thereof will be omitted.

On the other hand, according to another embodiment of the present invention, a thermoelectric element including the chalcogen-containing compound of the above-mentioned one embodiment as a thermoelectric conversion material is provided. Such a thermoelectric element can include the chalcogen-containing compound (thermoelectric conversion material) of the embodiment as a p-type or n-type thermoelectric conversion material. For this purpose, as the thermoelectric conversion material of the one embodiment, additional p-type or n-type elements may be included in an additionally doped state. However, the kind of p-type element or n-type element and the doping method usable herein are not particularly limited, and elements and doping methods which have been conventionally used for applying thermoelectric conversion materials as p-type or n-type may be applied.

The thermoelectric element may include a thermoelectric element formed by obtaining the p-type or n-type thermoelectric conversion materials in a sintered state, and then processing and molding it, and may also include an insulating substrate and an electrode. The coupling structure of the thermoelectric element, the insulating substrate, and the electrode may conform to the structure of a conventional thermoelectric element.

In addition, as the insulating substrate, a sapphire substrate, a silicon substrate, a pyrex substrate, a quartz substrate, or the like can be used. As the electrode, an electrode containing an arbitrary metal or a conductive metal compound can be used.

As the above-mentioned thermoelectric element includes the thermoelectric conversion material of one embodiment, it can exhibit excellent thermoelectric conversion characteristics, and the like, and it can be suitably applied to a thermoelectric cooling system or a thermoelectric power generation system in various fields and applications.

Advantageous Effects

According to the present invention, a novel chalcogen-containing compound which exhibits an excellent thermoelectric performance index (ZT) through an increase in power factor and a decrease in thermal conductivity, and a method for preparing the same, can be provided. In addition, a thermoelectric element exhibiting excellent properties by applying such chalcogen-containing compound can be provided.

DETAILED DESCRIPTION OF THE EMBODIMENTS

Hereinafter, the present invention will be described in more detail by way of examples. However, these examples are given to merely illustrate the invention and are not intended to limit the scope of the invention thereto.

Example 1: Preparation of $Na_{0.2}V_{0.8}Sn_6Sb_2Te_9$

The respective powders of Na, Sn, Sb, and Te, which are high purity raw materials, were weighed at a molar ratio of 0.2:6:2:9 in a glove box and placed in a graphite crucible, and then charged into a quartz tube. The inside of the quartz tube was evacuated and sealed. Then, the raw materials were kept at a constant temperature in an electric furnace at 750° C. for 12 hours, and then slowly cooled to room temperature. Thereafter, heat treatment was carried out at a temperature of 640° C. for 48 hours. The quartz tube in which the reaction had progressed was cooled with water to obtain an ingot. The ingot was finely pulverized into a powder having a particle size of 75 μm or less, and sintered according to a spark plasma sintering method (SPS) at a pressure of 50 MPa and a temperature of 600° C. for 8 minutes to prepare a chalcogen-containing compound of $Na_{0.2}V_{0.8}Sn_6Sb_2Te_9$.

Example 2: Preparation of $Na_{0.2}V_{0.8}Sn_8Sb_2Te_{11}$

A chalcogen-containing compound of $Na_{0.2}V_{0.8}Sn_8Sb_2Te_{11}$ was prepared in the same manner as in Example 1, except that the respective shots of Na, Sn, Sb, and Te, which are high purity raw materials, were mixed at a molar ratio of 0.2:8:2:11.

Example 3: Preparation of $Na_{0.2}V_{0.8}Sn_{10}Sb_2Te_{13}$

A chalcogen-containing compound of $Na_{0.2}V_{0.8}Sn_{10}Sb_2Te_{13}$ was prepared in the same manner as in Example 1, except that the respective powders of Na, Sn, Sb, and Te, which are high purity raw materials, were mixed at a molar ratio of 0.2:10:2:13.

Example 4: Preparation of $Na_{0.2}V_{0.8}Sn_{12}Sb_2Te_{15}$

A chalcogen-containing compound of $Na_{0.2}V_{0.8}Sn_{12}Sb_2Te_{15}$ was prepared in the same manner as in Example 1, except that the respective powders of Na, Sn, Sb, and Te, which are high purity raw materials, were mixed at a molar ratio of 0.2:12:2:15.

Example 5: Preparation of $Na_{0.1}V_{0.9}Sn_8Sb_2Te_{11}$

A chalcogen-containing compound of $Na_{0.1}V_{0.9}Sn_8Sb_2Te_{11}$ was prepared in the same manner as in Example 1, except that the respective powders of Na, Sn, Sb, and Te, which are high purity raw materials, were mixed at a molar ratio of 0.1:8:2:11.

Example 6: Preparation of $Na_{0.4}V_{0.6}Sn_8Sb_2Te_{11}$

A chalcogen-containing compound of $Na_{0.4}V_{0.6}Sn_8Sb_2Te_{11}$ was prepared in the same manner as in Example 1, except that the respective powders of Na, Sn, Sb, and Te, which are high purity raw materials, were mixed at a molar ratio of 0.4:8:2:11.

Comparative Example 1: Preparation of $VSn_6Sb_2Te_9$

A chalcogen-containing compound of $VSn_6Sb_2Te_9$ was prepared in the same manner as in Example 1, except that the respective powders of Sn, Sb, and Te, which are high purity raw materials, were mixed at a molar ratio of 6:2:9.

Comparative Example 2: Preparation of $VSn_8Sb_2Te_{11}$

A chalcogen-containing compound of $VSn_8Sb_2Te_{11}$ was prepared in the same manner as in Example 1, except that the respective powders of Sn, Sb, and Te, which are high purity raw materials, were mixed at a molar ratio of 8:2:11.

Comparative Example 3: Preparation of $VSn_{10}Sb_2Te_{13}$

A chalcogen-containing compound of $VSn_{10}Sb_2Te_{13}$ was prepared in the same manner as in Example 1, except that the respective powders of Sn, Sb, and Te, which are high purity raw materials, were mixed at a molar ratio of 10:2:13.

Comparative Example 4: Preparation of $VSn_{12}Sb_2Te_{15}$

A chalcogen-containing compound of $VSn_{12}Sb_2Te_{15}$ was prepared in the same manner as in Example 1, except that the respective powders of Sn, Sb, and Te, which are high purity raw materials, were mixed at a molar ratio of 12:2:15.

Comparative Example 5: Preparation of $VSn_4Sb_2Te_7$

A chalcogen-containing compound of $VSn_4Sb_2Te_7$ was prepared in the same manner as in Example 1, except that the respective powders of Sn, Sb, and Te, which are high purity raw materials, were mixed at a molar ratio of 4:2:7.

Comparative Example 6: Preparation of $Sn_{10}Sb_2Te_{12}$

A chalcogen-containing compound of $Sn_{10}Sb_2Te_{12}$ was prepared in the same manner as in Example 1, except that the respective powders of Sn, Sb, and Te, which are high purity raw materials, were mixed at a molar ratio of 10:2:12.

Comparative Example 7: Preparation of $Sn_{12}Sb_2Te_{14}$

A chalcogen-containing compound of $Sn_{12}Sb_2Te_{14}$ was prepared in the same manner as in Example 1, except that the respective powders of Sn, Sb, and Te, which are high purity raw materials, were mixed at a molar ratio of 12:2:14.

Comparative Example 8: Preparation of $NaSn_8Sb_2Te_{11}$

A chalcogen-containing compound of $NaSn_8Sb_2Te_{11}$ was prepared in the same manner as in Example 1, except that the respective powders of Na, Sn, Sb, and Te, which are high purity raw materials, were mixed at a molar ratio of 1:8:2:11.

Comparative Example 9: Preparation of $Na_{0.2}V_{0.4}Sn_8Sb_{2.4}Te_{11}$

A chalcogen-containing compound of $Na_{0.2}V_{0.4}Sn_8Sb_{2.4}Te_{11}$ was prepared in the same manner as in Example 1, except that the respective powders of Na, Sn, Sb, and Te, which are high purity raw materials, were mixed at a molar ratio of 0.2:8:2.4:11.

Comparative Example 10: Preparation of $Na_{0.2}Sn_8Sb_{2.8}Te_{11}$

A chalcogen-containing compound of $Na_{0.2}Sn_8Sb_{2.8}Te_{11}$ was prepared in the same manner as in Example 1, except that the respective powders of Na, Sn, Sb, and Te, which are high purity raw materials, were mixed at a molar ratio of 0.2:8:2.8:11.

Experimental Example 1: Phase Analysis According to XRD Pattern

Figure 3:
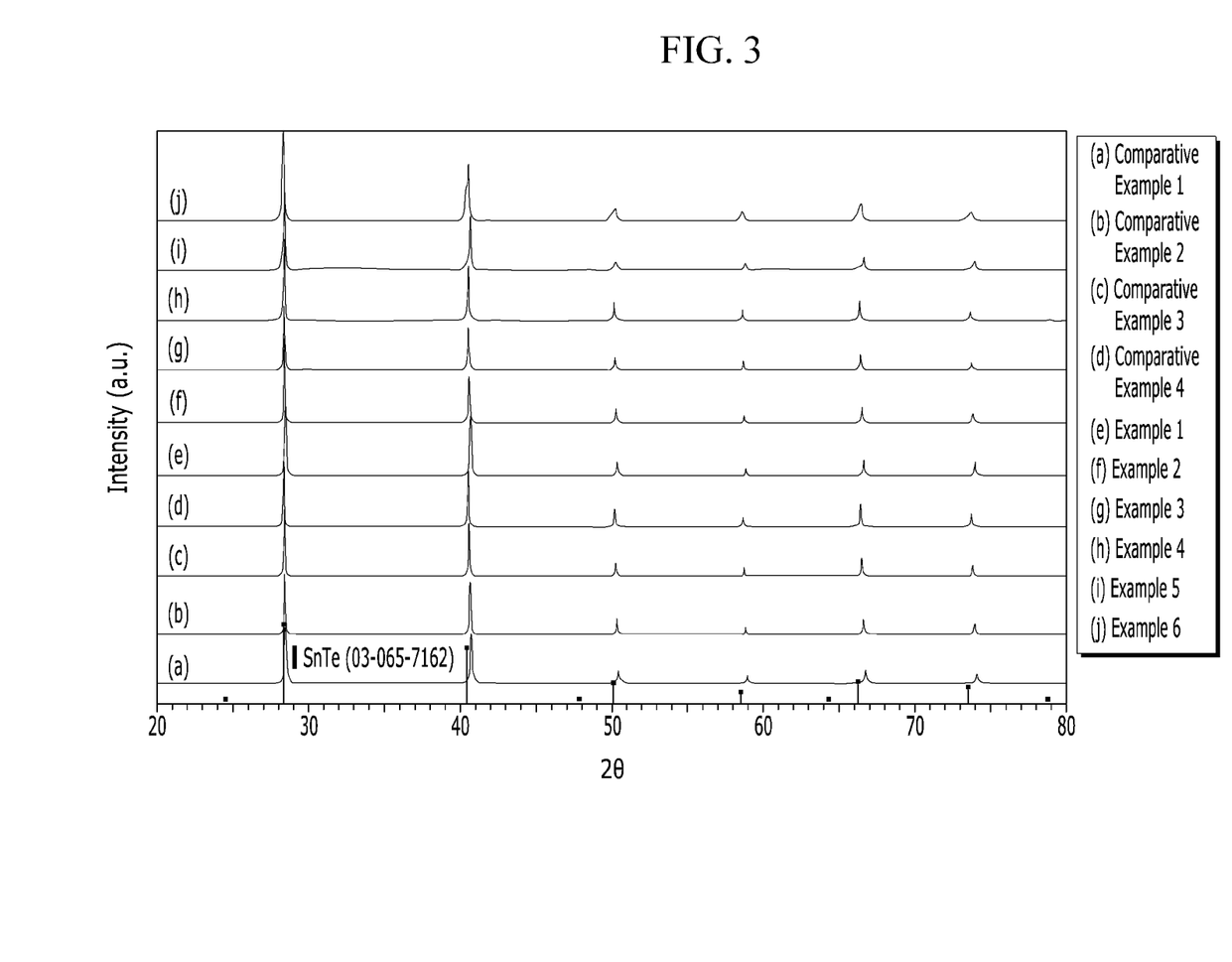
FIG. 3 is a graph showing the results of X-ray diffraction analysis of the chalcogen-containing compounds prepared in Examples 1 to 6 and Comparative Examples 1 to 4.
Figure 4:
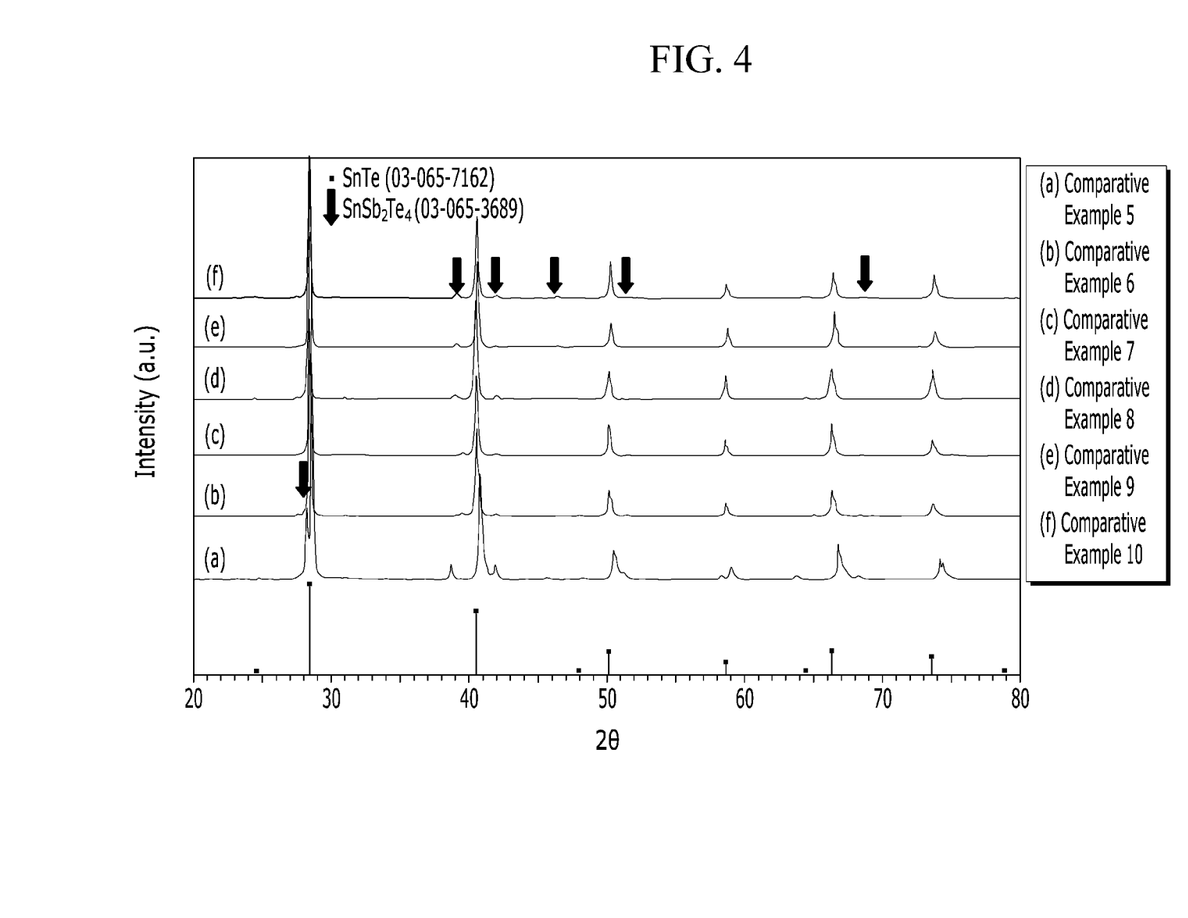
FIG. 4 is a graph showing the results of X-ray diffraction analysis of the chalcogen-containing compounds prepared in Comparative Examples 5 to 10.

X-ray diffraction analysis was performed for the composites in Examples 1 to 6 and Comparative Examples 1 to 10, and the results are shown in FIGS. 3 and 4, respectively.

For an X-ray diffraction analysis, each sample of the chalcogen-containing compounds prepared in the examples and comparative examples was pulverized well, placed in a sample holder of an X-ray diffractometer (Bruker D8-Advance XRD), and then scanned at 0.02 degree intervals, wherein Cu K$\alpha$1 ($\lambda$=1.5405 Å) X-ray radiation was used, the applied voltage was 40 KV, and the applied current was 40 mA.

First, referring to FIG. 3, in the case of the chalcogen-containing compounds of Examples 1 to 6 and Comparative Examples 1 to 4, it was confirmed that it has the same crystal lattice structures as that of SnTe, which was conventionally known to have a face-centered cubic lattice structure. From these results, it was confirmed that the compounds of Examples 1 to and Comparative Examples 1 to 4 all had a face-centered cubic crystal lattice structure.

Referring to FIG. 4, however, it was confirmed that in Comparative Examples 5 to 10, in addition to a material having a part of the same crystal structure as SnTe, a secondary phase of $SnSb_2Te_4$ having a rhombohedral structure was included together therewith. From these results, it can be seen that when the molar ratio (x) of Sn in the composition formula represented by Formula 1 is less than 6 (Comparative Example 5), when vacancies and an alkali metal (M) are not included and the molar ratio of Sn:Sb:Te does not satisfy the condition of x:2:(x+3)(Comparative Examples 6 and 7), when the vacancies are completely filled with Na (Comparative Example 8), when the alkali metal (M) and the vacancies are included but the condition of the molar ratio of Sn:Sb:Te is not satisfied (Comparative Example 9), and when, in the composition not including the vacancies, Na is included but the molar ratio condition of Sn:Sb:Te is not satisfied (Comparative Example 10), a secondary phase other than the face-centered cubic lattice structure is formed. Therefore, it can be seen that a chalcogen-containing compound having a single phase, face-centered cubic lattice structure can be formed when the molar ratio of Sn:Sb:Te satisfies the relationship of x:2:(x+3) while x is 6 or more and y is more than 0 and 0.4 or less.

Experimental Example 2: Analysis Using TOPAS Program

From the results of XRD analysis obtained from the above experiment, the lattice parameters were calculated for each of the chalcogen-containing compounds in powder states of Examples 1 to 6 and Comparative Examples 1 to 4 using the TOPAS program (R. W. Cheary, A. Coelho, J. Appl. Crystallogr. 25 (1992) 109-121; Bruker AXS, TOPAS 4.2, Karlsruhe, Germany (2009)), and the results are shown in Table 1 below. In addition, the Rietveld refinement results of the chalcogen-containing compounds of Examples 1 to 6 and Comparative Examples 1 to 4 calculated through the TOPAS program are shown in Table 2 below.

TABLE 1

|  | Lattice parameter (Å) | Calculated vacancy concentration |
|---|---|---|
| Comparative Example 1 | 6.2531 | 1/9 (0.1111) |
| Comparative Example 2 | 6.2650 | 1/11 (0.0909) |
| Comparative Example 3 | 6.2743 | 1/13 (0.0769) |
| Comparative Example 4 | 6.2807 | 1/15 (0.0 667) |
| Example 1 | 6.2637 | 0.8/9 (0.0889) |
| Example 2 | 6.2705 | 0.8/11 (0.0727) |
| Example 3 | 6.2801 | 0.8/13 (0.0615) |
| Example 4 | 6.2874 | 0.8/15 (0.0533) |
| Example 5 | 6.2665 | 0.9/11 (0.0818) |
| Example 6 | 6.2838 | 0.6/11 (0.0545) |

TABLE 2

| Unit (atomic %) | Comparative Example | | | | Example | | | | | |
|---|---|---|---|---|---|---|---|---|---|---|
|  | 1 | 2 | 3 | 4 | 1 | 2 | 3 | 4 | 5 | 6 |
| Vacancy (0, 0, 0) occupancy | 0.1111 | 0.0909 | 0.0769 | 0.0667 | 0.0889 | 0.0727 | 0.0615 | 0.0534 | 0.0818 | 0.0545 |
| Sn (0, 0, 0) occupancy | 0.6667 | 0.7273 | 0.7692 | 0.8 | 0.6667 | 0.7273 | 0.7692 | 0.8 | 0.7273 | 0.7273 |
| Sb (0, 0, 0) occupancy | 0.2222 | 0.1818 | 0.1538 | 0.1333 | 0.2222 | 0.1818 | 0.1538 | 0.1333 | 0.1818 | 0.1818 |
| Na (0, 0, 0) occupancy | 0 | 0 | 0 | 0 | 0.0222 | 0.0182 | 0.0182 | 0.0133 | 0.0091 | 0.0364 |
| Te (0.5, 0.5, 0.5) occupancy | 1 | 1 | 1 | 1 | 1 | 1 | 1 | 1 | 1 | 1 |
| Rwp (weighted pattern R) | 5.89 | 4.83 | 5.98 | 5.40 | 5.79 | 4.99 | 5.46 | 4.59 | 6.83 | 5.87 |

Referring to Table 1, as the content (x) of Sn in the face-centered cubic lattice increased, the value of the lattice parameter gradually increased (Comparative Example 4>Comparative Example 3>Comparative Example 2>Comparative Example 1, Example 4>Example 3>Example 1). This means that because the radius of $Sn^{2+}$ (118 pm) is larger than that of $Sb^{3+}$ (76 pm), the lattice parameter increases as the content of Sn increases (as the [Sn]/[Sb] ratio increases). On the other hand, as the vacancy was filled with Na in the material having the same $Sn_8Sb_2Te_{11}$ composition, the lattice parameter gradually increased (Example 6>Example 2>Example 5). Further, in the case of the examples in which Na was filled in vacancies, it can be confirmed that the lattice volume increased as the lattice parameter increased as compared with the comparative examples of similar composition. From this, it can be seen that Na was filled in the vacancy.

On the other hand, in the case of Comparative Examples 1 to 4, as the content of Sn increased, the vacancy content decreased in the lattice. In the case of Examples 1 to 4, by further filling with Na, the vacancy content was more decreased than in Comparative Examples 1 to 4. It can be seen that this is consistent with the Rietveld refinement results in Table 2. Referring to Table 2 above, it was confirmed that in the case of Examples 1 to 6, Na, vacancy, Sn, and Sb are randomly distributed at the site of (x, y, z)=(0, 0, 0) and Te is distributed at the site of (x, y, z)=(0.5, 0.5, 0.5). In addition, it was confirmed that even in the case of Comparative Examples 1 to 4, each atom is distributed at the same position except for Na, and each composition contained in the chalcogen-containing compounds is very similar to the initial contents of Na, Sn, Sb, and Te, which are high purity raw materials.

3. Evaluation of Temperature Dependence of Electrical Conductivity

Figure 5:
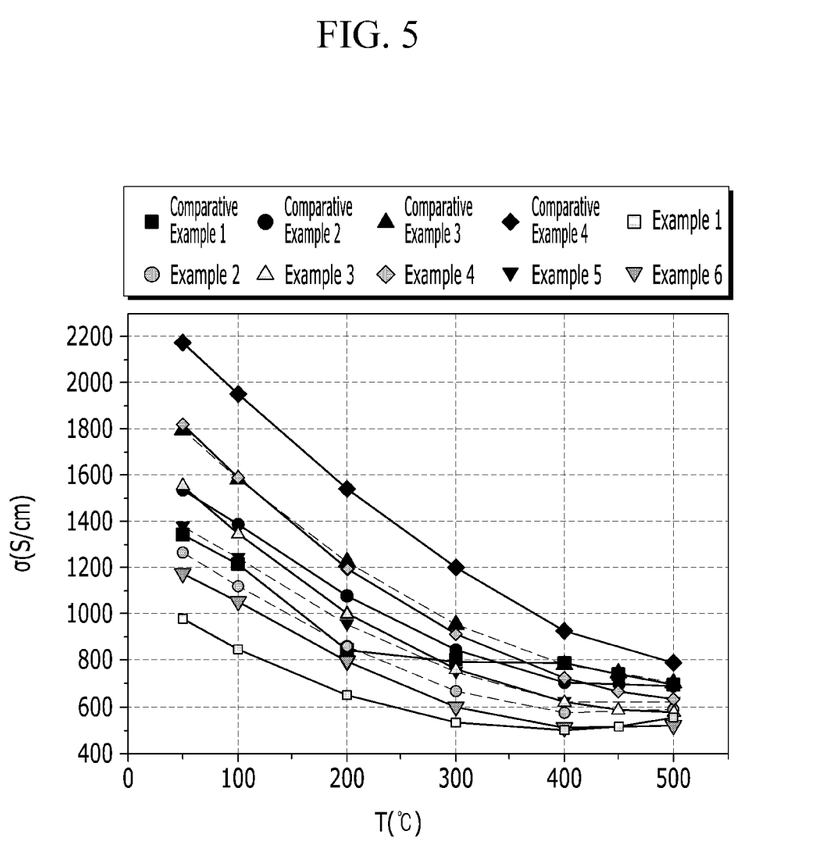
FIG. 5 is a graph showing the results of measuring electrical conductivity (o) versus temperature (T) of the chalcogen-containing compounds in Examples 1 to 6 and Comparative Examples 1 to 4.

For the chalcogen-containing compound samples prepared in Examples 1 to 6 and Comparative Examples 1 to 4, the electrical conductivity was measured according to the temperature change, and the results are shown in FIG. 5. The electrical conductivity was measured at a temperature range of 50° C. to 500° C. by a four-probe DC method using ZEM-3 (manufactured by ULVAC), which is a resistivity measuring device.

Referring to FIG. 5, in the case of Comparative Examples 1 to 4, the value of electrical conductivity increased as the content of Sn increased. This is because it supplies one electron less than Sb per Sn atom ($Sn^{2+}$ vs. $Sb^{3+}$ comparison), and therefore the number of supplied electrons decreases as the Sn content increases, and conversely, the hole concentration which is a main charge carrier of the material, increases. On the other hand, when comparing Examples 1 to 4 with Comparative Examples 1 to 4, it can be seen that the electrical conductivity was relatively decreased in the examples in which Na was added despite the same Sn/Sb ratio. Further, when comparing Examples 2, 5, and 6 in which the content of Na was changed, it can be seen that as the Na content increases, the electrical conductivity decreases. This confirms that because the hole concentration, which is a main carrier of a p-type material, is decreased due to the supply of additional electrons by Nat, the charge concentration additionally decreases due to the addition of Na.

4. Evaluation of Temperature Dependence of Seebeck Coefficient

Figure 6:
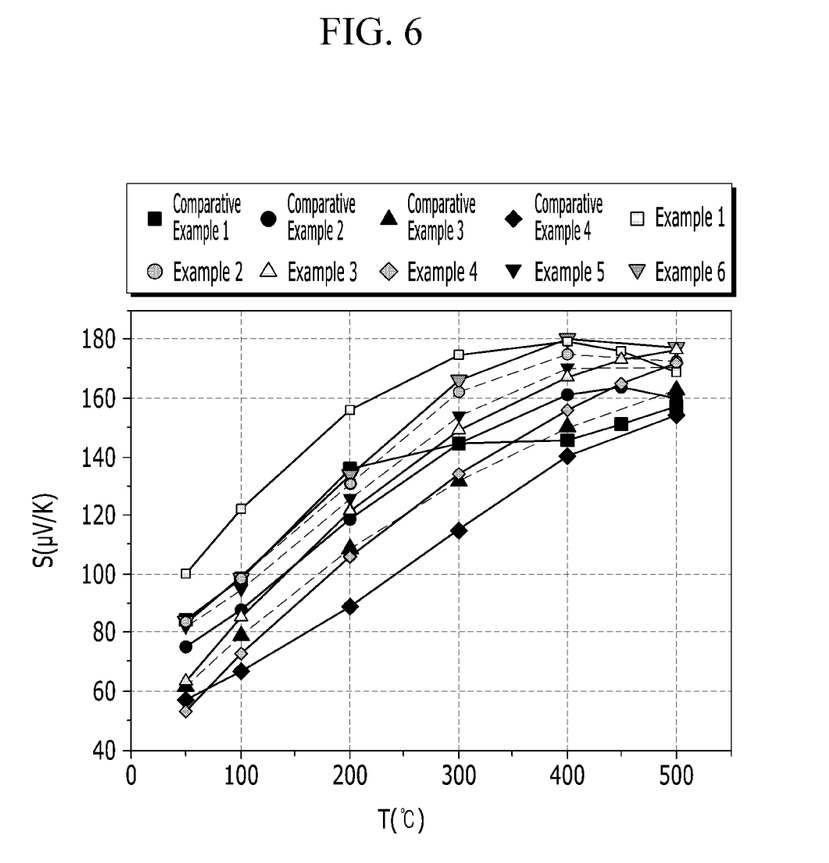
FIG. 6 is a graph showing the results of measuring the Seebeck coefficient (S) versus temperature (T) of the chalcogen-containing compounds in Examples 1 to 6 and Comparative Examples 1 to 4.

For the chalcogen-containing compound samples prepared in Examples 1 to 6 and Comparative Examples 1 to 4, the Seebeck coefficient (S) was measured according to the temperature change, and the results are shown in FIG. 6. The Seebeck coefficient was measured in a temperature range of 50° C. to 500° C. by using a measuring device ZEM-3 (manufactured by ULCAC) and applying a differential voltage/temperature technique.

As shown in FIG. 6, it can be seen that, in light of the fact that the positive (+) Seebeck coefficients are shown in Examples 1 to 6 and Comparative Examples 1 to 4, the main charge carriers of the material are holes and exhibit characteristics as a P-type semiconductor material. On the other hand, Comparative Examples 1 to 4 showed the tendency that the Seebeck coefficient decreases as the Sn content increases. Also, in the case of Examples 1 to 4, the same Seebeck coefficient change can be confirmed according to the content of Sn. On the other hand, when comparing Example 2, Example 5, and Example 6 in which the Na content was changed, it shows the tendency that the Seebeck coefficient increases as the Na content increases. This is because the Seebeck coefficient has an opposite tendency to the electrical conductivity in terms of the charge carrier concentration (the larger the charge carrier concentration, the higher the electrical conductivity but the lower the Seebeck coefficient).

5. Evaluation of Temperature Dependence of Power Factor

Figure 7:
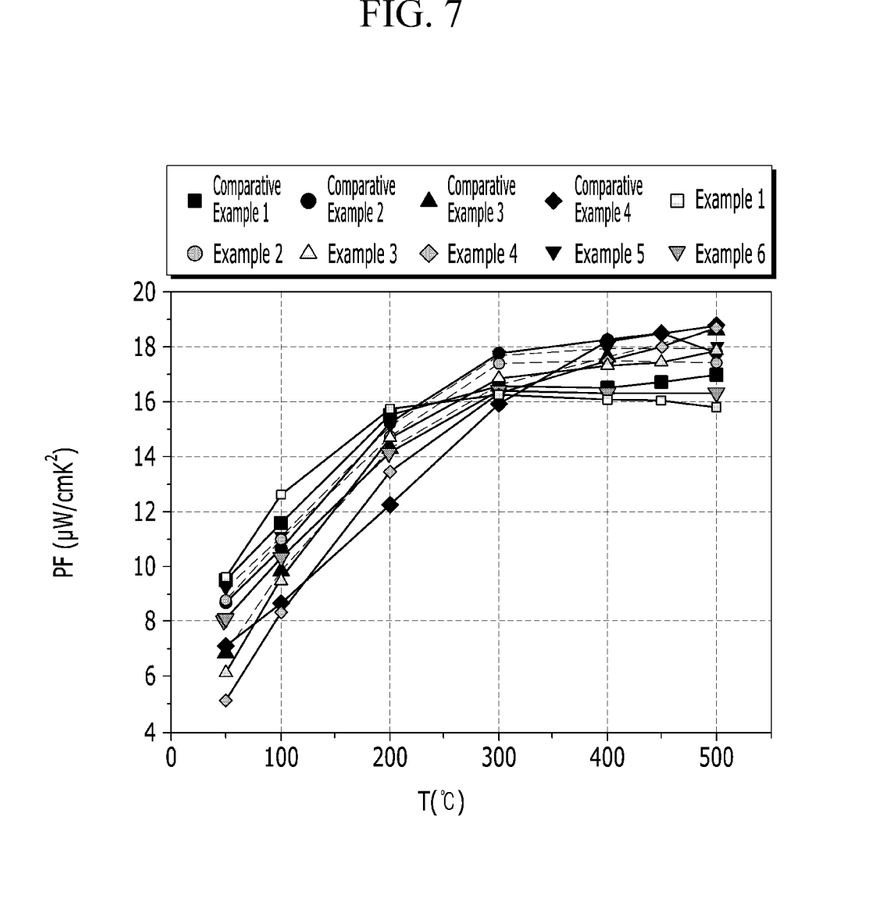
FIG. 7 is a graph showing the results of measuring the power factor (PF) versus temperature (T) of the chalcogen-containing compounds in Examples 1 to 6 and Comparative Examples 1 to 4.

For the chalcogen-containing compound samples prepared in Examples 1 to 6 and Comparative Examples 1 to 4, the power factor was calculated according to the temperature change, and the results are shown in FIG. 7. The power factor is defined as power factor (PF)=$\sigma S^2$ and was calculated using the values of $\sigma$ (electrical conductivity) and S (Seebeck coefficient) shown in FIG. 5 and FIG. 6.

As shown in FIG. 7, in Examples 1 to 4, as the content of Sn increases, a low power factor is exhibited in a low temperature part, and then the power factor increased as it moves to a high temperature part. From these results, it was confirmed that the same tendencies are exhibited even in Comparative Examples 1 to 4. This is because, upon increase of the Sn content, the hole charge concentration gradually increases, and as a result, the bipolar effect decreases, which means that the temperature showing the maximum value of the power factor moves to the high temperature part.

6. Evaluation of Temperature Dependence of Thermal Conductivity

Figure 8:
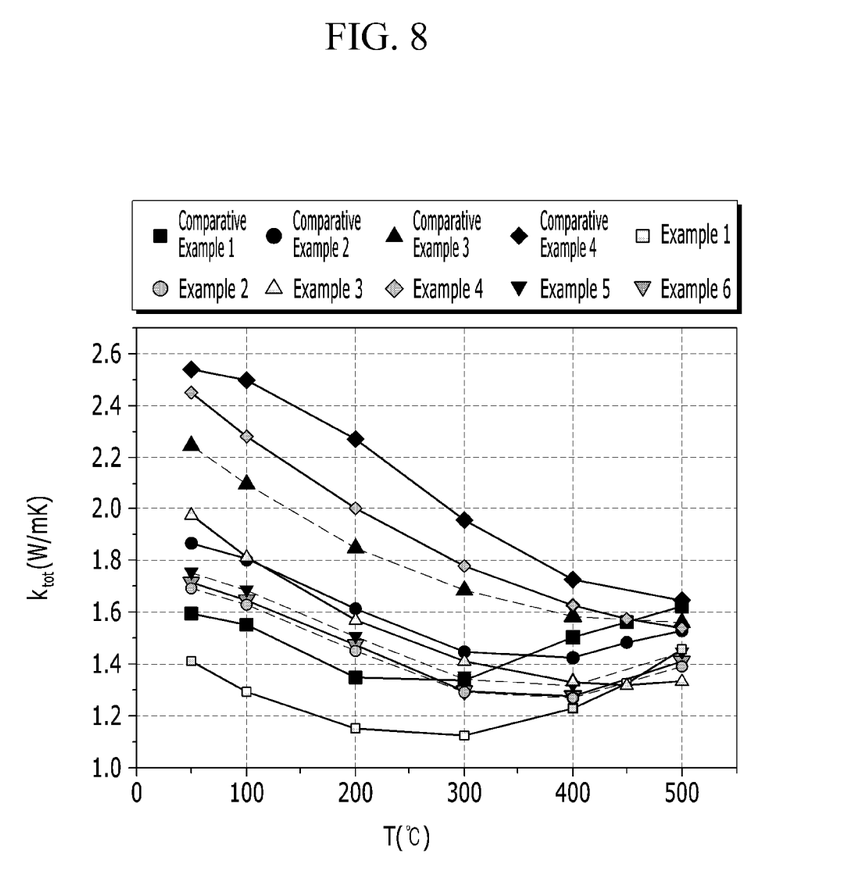
FIG. 8 is a graph showing the results of measuring the total thermal conductivity ($k_{tot}$) versus temperature (T) of the chalcogen-containing compounds in Examples 1 to 6 and Comparative Examples 1 to 4.

For the chalcogen-containing compound samples prepared in Examples 1 to 6 and Comparative Examples 1 to 4, the thermal conductivity, specifically, the total thermal conductivity ($k_{tot}$), was measured according to the temperature change, and the results are shown in FIG. 8.

In this experiment, the thermal diffusivity (D) and the thermal capacity ($C_p$) were measured by applying a laser scintillation method and using an LFA457 instrument (manufactured by Netzsch) which is a device for measuring the thermal conductivity, and then the total thermal conductivity ($k_{tot}$) was calculated by applying the measured value to the following Equation 1.

$$\text{Total Thermal Conductivity } (k_{tot})=D\rho C_p \quad \text{[Equation 1]}$$

(wherein $\rho$ is the density of a sample measured by the Archimedes method)

Referring to FIG. 8, Examples 1 to 4 showed that as the content of Sn increases, the total thermal conductivity gradually increases due to the increase of the charge concentration, but exhibited relatively low thermal conductivity as compared with Comparative Examples 1 to 4. This is because the hole charge concentration is reduced due to the addition of Na and consequently the thermal conductivity contributed by the charge carrier decreases. On the other hand, when comparing Example 2, Example 5, and Example 6 in which the content of Sn:Sb:Te was fixed and only the Na content was changed, it can be seen that as the Na content increases, the total thermal conductivity decreases slightly. This result has the same tendency as the electrical conductivity of FIG. 5.

7. Evaluation of Temperature Dependence of Thermoelectric Performance Index (ZT)

Figure 9:
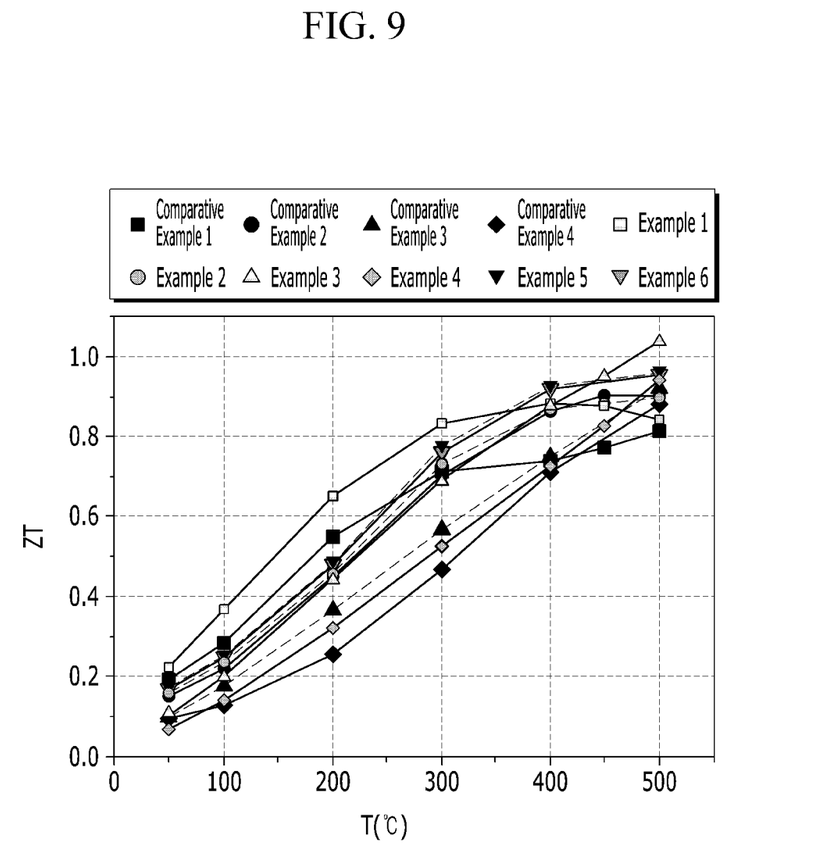
FIG. 9 is a graph showing the results of calculating the thermoelectric performance index (ZT) versus temperature (T) of the chalcogen-containing compounds in Examples 1 to 6 and Comparative Examples 1 to 4.

For the chalcogen-containing compound samples prepared in Examples 1 to 6 and Comparative Examples to 4, the thermoelectric performance index was calculated according to the temperature change, and the results are shown in FIG. 9.

The thermoelectric performance index (ZT) is defined as ZT=$S^2\sigma T/k$, and was calculated by using the values of S (Seebeck coefficient), $\sigma$ (electrical conductivity), T (absolute temperature), and k (thermal conductivity) obtained in the experimental examples.

Referring to FIG. 9, Examples 1 to 4 show low ZT at a low temperature part as the content of Sn increases, and then ZT increases as it moves to the high temperature part. The same tendency was also confirmed in Comparative Examples 1 to 4. On the other hand, when Comparing Examples 2, 5, and 6 in which only the Na content was changed, it can be confirmed that the change of the ZT value according to the change of Na content is not large, but the ZT value is improved as compared with Comparative Example 2 in which Na was not added. Further, Example 3 showed a very high value of ZT-1.03 at 500° C. As a result, it was improved by 11.8% as compared with Comparative Example 3.

Experimental Example 8. Evaluation of Average Thermoelectric Properties

Based on the experimental results in Experimental Examples 5 to 7, the average thermoelectric properties of the chalcogen-containing compounds prepared in Examples 1 to 6 and Comparative Examples 1 to 4 in the range from 100 to 500° C. were compared, and the results are shown in Table 3 below.

TABLE 3

Average thermoelectric properties at 100~500° C.

| | $PF_{average}$ (μW/cmK²) | $K_{tot,\ average}$ (W/mK) | $ZT_{average}$ | $ZT_{max}$ |
|---|---|---|---|---|
| Comparative Example 1 | 15.4 | 1.47 | 0.62 | 0.81 |
| Example 1 | 15.3 | 1.24 | 0.71 | 0.88 |
| Comparative Example 2 | 15.9 | 1.56 | 0.63 | 0.89 |
| Example 2 | 15.6 | 1.41 | 0.68 | 0.96 |
| Comparative Example 3 | 15.4 | 1.76 | 0.56 | 0.93 |
| Example 3 | 15.3 | 1.49 | 0.65 | 1.03 |
| Comparative Example 4 | 14.8 | 2.02 | 0.49 | 0.88 |
| Example 4 | 14.8 | 1.84 | 0.53 | 0.94 |
| Example 5 | 15.9 | 1.46 | 0.67 | 0.96 |
| Example 6 | 14.7 | 1.41 | 0.64 | 0.90 |

Referring to Table 3, in the case of the average power factor ($PF_{average}$) at 100 to 500° C., the values of the examples and the corresponding comparative examples were very similar. From these results, it can be seen that when filling Na in a part of vacancies, the electrical conductivity decreases, but the power factor is compensated due to the increase of the Seebeck coefficient.

In addition, in the case of the average thermal conductivity ($K_{tot}$, average), Examples 1 to 4 were reduced by 8 to 18% as compared with Comparative Examples 1 to 4, and the average ZT value ($ZT_{average}$) was improved by 8 to 14% as compared with Comparative Examples 1 to 4. From this, it can be confirmed that the heat conductivity is further improved by partially filling Na in the vacancies. In Examples 2, 5, and 6 in which only the content of Na was changed, the average power factor was similar to that of Comparative Example 2 except for Example 6 in which Na was 0.4, as compared with Comparative Example 2 in which Na was not included. However, it was confirmed that the average ZT value and $ZT_{max}$ increase due to the decrease of the average thermal conductivity value. On the other hand, the chalcogen-containing compound of Example 3, in which y=0.2 and x=10, exhibited a $ZT_{max}$ of 1.0 or more, and the $ZT_{max}$ was improved by 11.8% or more as compared with the chalcogen-containing compounds of the comparative examples not containing an alkali metal.

The invention claimed is:

1. A chalcogen-containing compound represented by the following Chemical Formula 1:

[Chemical Formula 1]

$M_y V_{1-y} Sn_x Sb_2 Te_{x+3}$ wherein, in the above Chemical Formula 1, V is vacancy, M is at least one alkali metal, x≥6, and 0<y≤0.4; and wherein the alkali metal (M) is filled in a part of the vacancy (V).

2. The chalcogen-containing compound of claim 1, wherein the M is at least one alkali metal selected from the group consisting of Na and K.

3. The chalcogen-containing compound of claim 1, wherein the chalcogen-containing compound has a face-centered cubic crystal lattice structure.

4. The chalcogen-containing compound of claim 3, wherein the V, Sn, Sb, and M are randomly distributed at a site of (x, y, z) =(0, 0, 0), and Te is distributed at a site of (x, y, z) =(0.5, 0.5, 0.5).

5. The chalcogen-containing compound of claim 1, wherein 6≤x≤12 and 0.01≤y≤0.4.

6. The chalcogen-containing compound of claim 1, which is selected from the group consisting of $Na_{0.2}V_{0.8}Sn_6Sb_2Te_9$, $Na_{0.2}V_{0.8}Sn_8Sb_2Te_{11}$, $Na_{0.2}V_{0.8}Sn_{10}Sb_2Te_{13}$, $Na_{0.2}V_{0.8}Sn_{12}Sb_2Te_{15}$, $Na_{0.1}V_{0.9}Sn_8Sb_2Te_{11}$, and $Na_{0.4}V_{0.6}Sn_8Sb_2Te_{11}$.

7. A method for preparing the chalcogen-containing compound of claim 1 comprising:
mixing raw materials of Sn, Sb, Te, and M so that a molar ratio of Sn:Sb:Te:M is x:2:(x+3):y and then subjecting the mixture to a melting reaction wherein x≥6 and 0≤y≤0.4, and M is at least one alkali metal;
heat-treating the resultant product obtained through the melting reaction;
pulverizing the resultant product obtained through the heat treatment; and
sintering the pulverized product.

8. The method for preparing the chalcogen-containing compound of claim 7, wherein the melting is carried out at a temperature of 700 to 900° C.

9. The method for preparing the chalcogen-containing compound of claim 7, wherein the heat treatment is carried out at a temperature of 550 to 640° C.

10. The method for preparing the chalcogen-containing compound of claim 7, further comprising a step of cooling the resultant of the heat treatment step to form an ingot between the heat treatment step and the pulverization step.

11. The method for preparing the chalcogen-containing compound of claim 7, wherein the sintering is carried out by a spark plasma sintering method.

12. The method for preparing the chalcogen-containing compound of claim 7, wherein the sintering is carried out at a temperature of 550 to 640° C. under a pressure of 10 to 100 MPa.

13. A thermoelectric element comprising the chalcogen-containing compound of claim 1.

* * * * *